United States Patent
McAvoy et al.

(10) Patent No.: US 7,971,971 B2
(45) Date of Patent: *Jul. 5, 2011

(54) INKJET NOZZLE ASSEMBLY HAVING BILAYERED PASSIVE BEAM

(75) Inventors: Gregory John McAvoy, Dublin (IE); Vincent Patrick Lawlor, Dublin (IE); Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 0 days.

This patent is subject to a terminal disclaimer.

(21) Appl. No.: 12/786,268

(22) Filed: May 24, 2010

(65) Prior Publication Data
US 2010/0231652 A1    Sep. 16, 2010

Related U.S. Application Data

(63) Continuation of application No. 11/685,074, filed on Mar. 12, 2007, now Pat. No. 7,735,970, which is a continuation-in-part of application No. 11/607,976, filed on Dec. 4, 2006.

(51) Int. Cl.
*B41J 2/05* (2006.01)
(52) U.S. Cl. .......................... 347/56; 347/65
(58) Field of Classification Search .............. 347/54, 347/56, 65
See application file for complete search history.

(56) References Cited

U.S. PATENT DOCUMENTS

| | | |
|---|---|---|
| 5,719,604 A | 2/1998 | Inui et al. |
| 6,174,050 B1 | 1/2001 | Kashino et al. |
| 6,211,598 B1 | 4/2001 | Dhuler et al. |
| 6,598,960 B1 | 7/2003 | Cabal et al. |
| 6,721,020 B1 | 4/2004 | Delametter et al. |
| 6,786,574 B2 | 9/2004 | Silverbrook |
| 7,011,394 B2 | 3/2006 | Cabal et al. |
| 7,025,443 B2 | 4/2006 | Cabal et al. |
| 7,066,575 B2 | 6/2006 | Silverbrook |
| 7,073,890 B2 * | 7/2006 | Cabal et al. ..................... 347/54 |
| 7,287,831 B2 | 10/2007 | Silverbrook |
| 7,611,225 B2 | 11/2009 | McAvoy et al. |
| 7,618,124 B2 | 11/2009 | McAvoy et al. |
| 7,654,641 B2 | 2/2010 | McAvoy et al. |
| 7,654,643 B2 | 2/2010 | Silverbrook |
| 7,794,056 B2 | 9/2010 | McAvoy et al. |
| 2001/0008406 A1 | 7/2001 | Silverbrook |
| 2003/0067516 A1 | 4/2003 | Lebens et al. |
| 2004/0263573 A1 | 12/2004 | Cabal et al. |
| 2005/0046672 A1 | 3/2005 | Cabal et al. |
| 2005/0243131 A1 | 11/2005 | Silverbrook |
| 2006/0158484 A1 | 7/2006 | Greywall |
| 2008/0129783 A1 | 6/2008 | McAvoy et al. |
| 2010/0231652 A1 | 9/2010 | McAvoy et al. |

FOREIGN PATENT DOCUMENTS

| | | | |
|---|---|---|---|
| WO | 0202328 A1 | 1/2002 | |
| WO | WO 02/02328 A1 | 1/2002 | |

* cited by examiner

*Primary Examiner* — An H Do

(57) ABSTRACT

An inkjet nozzle assembly includes: a nozzle chamber having a nozzle opening and an ink inlet; and a thermal bend actuator for ejecting ink through the nozzle opening. The actuator includes: an active beam for connection to drive circuitry; a first passive beam fused to the active beam; and a second passive beam fused to the second first passive beam. The first passive beam is sandwiched between the active beam and the second passive beam such that when a current is passed through the active beam, the active beam expands relative to the passive beams, resulting in bending of the actuator and ejection of ink through the nozzle opening.

8 Claims, 14 Drawing Sheets

INKJET NOZZLE ASSEMBLY HAVING BILAYERED PASSIVE BEAM

CROSS REFERENCE TO RELATED APPLICATION

The present application is a Continuation of U.S. application Ser. No. 11/685,074 filed Mar. 12, 2007, now issued as U.S. Pat. No. 7,735,970 which is a Continuation-in-Part of U.S. application Ser. No. 11/607,976 filed 4 Dec. 2006, all of which is herein incorporated by reference.

FIELD OF THE INVENTION

This invention relates to thermal bend actuators. It has been developed primarily to provide improved inkjet nozzles which eject ink via thermal bend actuation.

CROSS REFERENCES

The following patents or patent applications filed by the applicant or assignee of the present invention are hereby incorporated by cross-reference.

| | | | | |
|---|---|---|---|---|
| 6,988,841 | 6,641,315 | 6,786,661 | 6,808,325 | 6,750,901 |
| 6,476,863 | 6,788,336 | 6,712,453 | 6,460,971 | 6,428,147 |
| 6,416,170 | 6,402,300 | 6,464,340 | 6,612,687 | 6,412,912 |
| 6,447,099 | 7,249,108 | 6,566,858 | 6,331,946 | 6,246,970 |
| 6,442,525 | 7,346,586 | 7,685,423 | 6,374,354 | 7,246,098 |
| 6,816,968 | 6,757,832 | 6,334,190 | 6,745,331 | 7,249,109 |
| 7,197,642 | 7,093,139 | 7,509,292 | 7,685,424 | 10/866,608 |
| 7,210,038 | 7,401,223 | 7,702,926 | 7,716,098 | 7,090,337 |
| 7,461,924 | 6,913,346 | 7,156,494 | 7,032,998 | 6,994,424 |
| 7,001,012 | 7,004,568 | 7,040,738 | 7,188,933 | 7,131,715 |
| 7,261,392 | 7,182,435 | 7,097,285 | 7,083,264 | 7,147,304 |
| 7,156,498 | 7,201,471 | 7,549,728 | 7,364,256 | 7,258,417 |
| 7,293,853 | 7,328,968 | 7,270,395 | 7,461,916 | 7,510,264 |
| 7,334,864 | 7,255,419 | 7,284,819 | 7,229,148 | 7,258,416 |
| 7,273,263 | 7,270,393 | 6,984,017 | 7,347,526 | 7,357,477 |
| 7,465,015 | 7,364,255 | 7,357,476 | 11/003,614 | 7,284,820 |
| 7,341,328 | 7,246,875 | 7,322,669 | 7,445,311 | 7,452,052 |
| 7,455,383 | 7,448,724 | 7,441,864 | 7,637,588 | 7,648,222 |
| 7,669,958 | 7,607,755 | 7,699,433 | 7,658,463 | 7,506,958 |
| 7,472,981 | 7,448,722 | 7,575,297 | 7,438,381 | 7,441,863 |
| 7,438,382 | 7,425,051 | 7,399,057 | 7,695,097 | 7,686,419 |
| 11/246,669 | 7,448,720 | 7,448,723 | 7,445,310 | 7,399,054 |
| 7,425,049 | 7,367,648 | 7,370,936 | 7,401,886 | 7,506,952 |
| 7,401,887 | 7,384,119 | 7,401,888 | 7,387,358 | 7,413,281 |
| 7,530,663 | 7,467,846 | 7,669,957 | 11/482,963 | 11/482,956 |
| 7,695,123 | 11/482,974 | 7,604,334 | 11/482,987 | 7,708,375 |
| 7,695,093 | 7,695,098 | 7,722,156 | 7,703,882 | 7,581,812 |
| 7,641,304 | 11/495,817 | 6,227,652 | 6,213,588 | 6,213,589 |
| 6,231,163 | 6,247,795 | 6,394,581 | 6,244,691 | 6,257,704 |
| 6,416,168 | 6,220,694 | 6,257,705 | 6,247,794 | 6,234,610 |
| 6,247,793 | 6,264,306 | 6,241,342 | 6,247,792 | 6,264,307 |
| 6,254,220 | 6,234,611 | 6,302,528 | 6,283,582 | 6,239,821 |
| 6,338,547 | 6,247,796 | 6,557,977 | 6,390,603 | 6,362,843 |
| 6,293,653 | 6,312,107 | 6,227,653 | 6,234,609 | 6,238,040 |
| 6,188,415 | 6,227,654 | 6,209,989 | 6,247,791 | 6,336,710 |
| 6,217,153 | 6,416,167 | 6,243,113 | 6,283,581 | 6,247,790 |
| 6,260,953 | 6,267,469 | 6,588,882 | 6,742,873 | 6,918,655 |
| 6,547,371 | 6,938,989 | 6,598,964 | 6,923,526 | 6,273,544 |
| 6,309,048 | 6,420,196 | 6,443,558 | 6,439,689 | 6,378,989 |
| 6,848,181 | 6,634,735 | 6,299,289 | 6,299,290 | 6,425,654 |
| 6,902,255 | 6,623,101 | 6,406,129 | 6,505,916 | 6,457,809 |
| 6,550,895 | 6,457,812 | 7,152,962 | 6,428,133 | 7,216,956 |
| 7,080,895 | 7,442,317 | 7,182,437 | 7,204,941 | 7,282,164 |
| 7,465,342 | 7,278,727 | 7,417,141 | 7,452,989 | 7,367,665 |
| 7,138,391 | 7,153,956 | 7,423,728 | 7,456,277 | 7,550,585 |
| 7,122,076 | 7,148,345 | 7,470,315 | 7,572,327 | 7,658,792 |
| 7,709,633 | 11/482,985 | 11/454,899 | 11/583,942 | 7,416,280 |
| 7,252,366 | 7,488,051 | 7,360,865 | 7,275,811 | 7,628,468 |
| 7,334,874 | 7,393,083 | 7,472,984 | 7,410,250 | 7,360,871 |
| 7,661,793 | 7,708,372 | 7,147,792 | 7,175,774 | 7,404,625 |

-continued

| | | | | |
|---|---|---|---|---|
| 7,350,903 | 11/482,967 | 11/482,966 | 11/482,988 | 7,681,000 |
| 7,438,371 | 7,465,017 | 7,441,862 | 7,654,636 | 7,458,659 |
| 7,455,376 | 11/124,158 | 11/124,196 | 11/124,199 | 11/124,162 |
| 11/124,202 | 11/124,197 | 11/124,198 | 7,284,921 | 11/124,151 |
| 7,407,257 | 7,470,019 | 7,645,022 | 7,392,950 | 11/124,149 |
| 7,360,880 | 7,517,046 | 7,236,271 | 11/124,174 | 11/124,194 |
| 11/124,164 | 7,465,047 | 7,607,774 | 11/124,166 | 11/124,150 |
| 11/124,172 | 11/124,165 | 7,566,182 | 11/124,185 | 11/124,184 |
| 11/124,182 | 7,715,036 | 11/124,171 | 11/124,181 | 7,697,159 |
| 7,595,904 | 7,726,764 | 11/124,159 | 7,370,932 | 7,404,616 |
| 11/124,187 | 11/124,189 | 11/124,190 | 7,500,268 | 7,558,962 |
| 7,447,908 | 11/124,178 | 7,661,813 | 7,456,994 | 7,431,449 |
| 7,466,444 | 11/124,179 | 7,680,512 | 11/187,976 | 11/188,011 |
| 7,562,973 | 7,530,446 | 11/228,540 | 11/228,500 | 7,668,540 |
| 11/228,530 | 11/228,490 | 11/228,531 | 11/228,504 | 11/228,533 |
| 11/228,502 | 11/228,507 | 7,708,203 | 11/228,505 | 7,641,115 |
| 7,697,714 | 7,654,444 | 11/228,484 | 7,499,765 | 11/228,518 |
| 11/228,536 | 11/228,496 | 7,558,563 | 11/228,506 | 11/228,516 |
| 11/228,526 | 11/228,539 | 11/228,538 | 11/228,524 | 11/228,523 |
| 7,506,802 | 7,724,399 | 11/228,527 | 7,403,797 | 11/228,520 |
| 7,646,503 | 11/228,511 | 7,672,664 | 11/228,515 | 11/228,537 |
| 11/228,534 | 11/228,491 | 11/228,499 | 11/228,509 | 11/228,492 |
| 7,558,599 | 11/228,510 | 11/228,508 | 11/228,512 | 11/228,514 |
| 11/228,494 | 7,438,215 | 7,689,249 | 7,621,442 | 7,575,172 |
| 7,357,311 | 7,380,709 | 7,428,986 | 7,403,796 | 7,407,092 |
| 11/228,513 | 7,637,424 | 7,469,829 | 11/228,535 | 7,558,597 |
| 7,558,598 | 6,238,115 | 6,386,535 | 6,398,344 | 6,612,240 |
| 6,752,549 | 6,805,049 | 6,971,313 | 6,899,480 | 6,860,664 |
| 6,925,935 | 6,966,636 | 7,024,995 | 7,284,852 | 6,926,455 |
| 7,056,038 | 6,869,172 | 7,021,843 | 6,988,845 | 6,964,533 |
| 6,981,809 | 7,284,822 | 7,258,067 | 7,322,757 | 7,222,941 |
| 7,284,925 | 7,278,795 | 7,249,904 | 7,152,972 | 7,513,615 |
| 6,938,992 | 6,994,425 | 6,863,379 | 7,134,741 | 7,066,577 |
| 7,125,103 | 7,213,907 | 7,581,819 | 6,746,105 | 6,764,166 |
| 6,652,074 | 7,175,260 | 6,682,174 | 6,648,453 | 6,682,176 |
| 6,998,062 | 6,767,077 | 11/246,687 | 7,645,026 | 7,322,681 |
| 7,708,387 | 11/246,703 | 7,712,884 | 7,510,267 | 7,465,041 |
| 11/246,712 | 7,465,032 | 7,401,890 | 7,401,910 | 7,470,010 |
| 11/246,702 | 7,431,432 | 7,465,037 | 7,445,317 | 7,549,735 |
| 7,597,425 | 7,661,800 | 7,712,869 | 7,156,508 | 7,159,972 |
| 7,083,271 | 7,165,834 | 7,080,894 | 7,201,469 | 7,090,336 |
| 7,156,489 | 7,413,283 | 7,438,385 | 7,083,257 | 7,258,422 |
| 7,255,423 | 7,219,980 | 7,591,533 | 7,416,274 | 7,367,649 |
| 7,118,192 | 7,618,121 | 7,322,672 | 7,077,505 | 7,198,354 |
| 7,077,504 | 7,614,724 | 7,198,355 | 7,401,894 | 7,322,676 |
| 7,152,959 | 7,213,906 | 7,178,901 | 7,222,938 | 7,108,353 |
| 7,104,629 | 7,455,392 | 7,370,939 | 7,429,095 | 7,404,621 |
| 7,261,401 | 7,461,919 | 7,438,388 | 7,328,972 | 7,322,673 |
| 7,306,324 | 7,303,930 | 7,401,405 | 7,464,466 | 7,464,465 |
| 7,246,886 | 7,128,400 | 7,108,355 | 6,991,322 | 7,287,836 |
| 7,118,197 | 7,575,298 | 7,364,269 | 7,077,493 | 6,962,402 |
| 7,686,429 | 7,147,308 | 7,524,034 | 7,118,198 | 7,168,790 |
| 7,172,270 | 7,229,155 | 6,830,318 | 7,195,342 | 7,175,261 |
| 7,465,035 | 7,108,356 | 7,118,202 | 7,510,269 | 7,134,744 |
| 7,510,270 | 7,134,743 | 7,182,439 | 7,210,768 | 7,465,036 |
| 7,134,745 | 7,156,484 | 7,118,201 | 7,111,926 | 7,431,433 |
| 7,018,021 | 7,401,901 | 7,468,139 | 7,128,402 | 7,387,369 |
| 7,484,832 | 11/490,041 | 7,506,968 | 7,284,839 | 7,246,885 |
| 7,229,156 | 7,533,970 | 7,467,855 | 7,293,858 | 7,520,594 |
| 7,588,321 | 7,258,427 | 7,556,350 | 7,278,716 | 7,448,729 |
| 7,246,876 | 7,431,431 | 7,419,249 | 7,377,623 | 7,328,978 |
| 7,334,876 | 7,147,306 | 7,261,394 | 7,654,645 | 11/482,977 |
| 7,721,948 | 7,079,712 | 6,825,945 | 7,330,974 | 6,813,039 |
| 6,987,506 | 7,038,797 | 6,980,318 | 6,816,274 | 7,102,772 |
| 7,350,236 | 6,681,045 | 6,728,000 | 7,173,722 | 7,088,459 |
| 7,707,082 | 7,068,382 | 7,062,651 | 6,789,194 | 6,789,191 |
| 6,644,642 | 6,502,614 | 6,622,999 | 6,669,385 | 6,549,935 |
| 6,987,573 | 6,727,996 | 6,591,884 | 6,439,706 | 6,760,119 |
| 7,295,332 | 6,290,349 | 6,428,155 | 6,785,016 | 6,870,966 |
| 6,822,639 | 6,737,591 | 7,055,739 | 7,233,320 | 6,830,196 |
| 6,832,717 | 6,957,768 | 7,456,820 | 7,170,499 | 7,106,888 |
| 7,123,239 | 10/727,162 | 7,377,608 | 7,399,043 | 7,121,639 |
| 7,165,824 | 7,152,942 | 10/727,157 | 7,181,572 | 7,096,137 |
| 7,302,592 | 7,278,034 | 7,188,282 | 7,592,829 | 10/727,180 |
| 10/727,179 | 10/727,192 | 10/727,274 | 7,707,621 | 7,523,111 |
| 7,573,301 | 7,660,998 | 10/754,536 | 10/754,938 | 10/727,160 |
| 7,171,323 | 7,278,697 | 7,360,131 | 7,519,772 | 7,328,115 |
| 7,369,270 | 6,795,215 | 7,070,098 | 7,154,638 | 6,805,419 |
| 6,859,289 | 6,977,751 | 6,398,332 | 6,394,573 | 6,622,923 |
| 6,747,760 | 6,921,144 | 10/884,881 | 7,092,112 | 7,192,106 |

| | | | | |
|---|---|---|---|---|
| 7,457,001 | 7,173,739 | 6,986,560 | 7,008,033 | 7,551,324 |
| 7,222,780 | 7,270,391 | 7,525,677 | 7,388,689 | 7,571,906 |
| 7,195,328 | 7,182,422 | 7,374,266 | 7,427,117 | 7,448,707 |
| 7,281,330 | 10/854,503 | 7,328,956 | 10/854,509 | 7,188,928 |
| 7,093,989 | 7,377,609 | 7,600,843 | 10/854,498 | 10/854,511 |
| 7,390,071 | 10/854,525 | 10/854,526 | 7,549,715 | 7,252,353 |
| 7,607,757 | 7,267,417 | 10/854,505 | 7,517,036 | 7,275,805 |
| 7,314,261 | 7,281,777 | 7,290,852 | 7,484,831 | 10/854,523 |
| 10/854,527 | 7,549,718 | 10/854,520 | 7,631,190 | 7,557,941 |
| 10/854,499 | 10/854,501 | 7,266,661 | 7,243,193 | 10/854,518 |
| 10/934,628 | 7,163,345 | 7,322,666 | 11/544,764 | 11/544,765 |
| 11/544,772 | 11/544,774 | 11/544,775 | 7,425,048 | 11/544,766 |
| 11/544,767 | 7,384,128 | 7,604,321 | 7,722,163 | 7,681,970 |
| 7,425,047 | 7,413,288 | 7,465,033 | 7,452,055 | 7,470,002 |
| 7,722,161 | 7,475,963 | 7,448,735 | 7,465,042 | 7,448,739 |
| 7,438,399 | 11/293,794 | 7,467,853 | 7,461,922 | 7,465,020 |
| 7,722,185 | 7,461,910 | 11/293,828 | 7,270,494 | 7,632,032 |
| 7,475,961 | 7,547,088 | 7,611,239 | 11/293,819 | 11/293,818 |
| 7,681,876 | 11/293,816 | 7,703,903 | 7,448,734 | 7,425,050 |
| 7,364,263 | 7,201,468 | 7,360,868 | 7,234,802 | 7,303,255 |
| 7,287,846 | 7,156,511 | 10/760,264 | 7,258,432 | 7,097,291 |
| 7,645,025 | 10/760,248 | 7,083,273 | 7,367,647 | 7,374,355 |
| 7,441,880 | 7,547,092 | 10/760,206 | 7,513,598 | 10/760,270 |
| 7,198,352 | 7,364,264 | 7,303,251 | 7,201,470 | 7,121,655 |
| 7,293,861 | 7,232,208 | 7,328,985 | 7,344,232 | 7,083,272 |
| 7,311,387 | 7,621,620 | 7,669,961 | 7,331,663 | 7,360,861 |
| 7,328,973 | 7,427,121 | 7,407,262 | 7,303,252 | 7,249,822 |
| 7,537,309 | 7,311,382 | 7,360,860 | 7,364,257 | 7,390,075 |
| 7,350,896 | 7,429,096 | 7,384,135 | 7,331,660 | 7,416,287 |
| 7,488,052 | 7,322,684 | 7,322,685 | 7,311,381 | 7,270,405 |
| 7,303,268 | 7,470,007 | 7,399,072 | 7,393,076 | 7,681,967 |
| 7,588,301 | 7,249,833 | 7,524,016 | 7,490,927 | 7,331,661 |
| 7,524,043 | 7,300,140 | 7,357,492 | 7,357,493 | 7,566,106 |
| 7,380,902 | 7,284,816 | 7,284,845 | 7,255,430 | 7,390,080 |
| 7,328,984 | 7,350,913 | 7,322,671 | 7,380,910 | 7,431,424 |
| 7,470,006 | 7,585,054 | 7,347,534 | 7,441,865 | 7,469,989 |
| 7,367,650 | 7,469,990 | 7,441,882 | 7,556,364 | 7,357,496 |
| 7,467,863 | 7,431,440 | 7,431,443 | 7,527,353 | 7,524,023 |
| 7,513,603 | 7,467,852 | 7,465,045 | 7,645,034 | 7,637,602 |
| 7,645,033 | 7,661,803 | 11/495,819 | 7,607,756 | 7,431,446 |
| 6,988,789 | 7,198,346 | 11/013,881 | 7,083,261 | 7,070,258 |
| 7,398,597 | 7,178,903 | 7,325,918 | 7,083,262 | 7,192,119 |
| 7,073,892 | 7,036,912 | 7,147,302 | 7,380,906 | 7,178,899 |
| 7,258,425 | 7,497,555 | 6,485,123 | 6,425,657 | 6,488,358 |
| 7,021,746 | 6,712,986 | 6,981,757 | 6,505,912 | 6,439,694 |
| 6,364,461 | 6,378,990 | 6,425,658 | 6,488,361 | 6,814,429 |
| 6,471,336 | 6,457,813 | 6,540,331 | 6,454,396 | 6,464,325 |
| 6,435,664 | 6,412,914 | 6,550,896 | 6,439,695 | 6,447,100 |
| 7,381,340 | 6,488,359 | 6,623,108 | 6,698,867 | 6,488,362 |
| 6,425,651 | 6,435,667 | 6,527,374 | 6,582,059 | 6,513,908 |
| 6,540,332 | 6,679,584 | 6,857,724 | 6,652,052 | 6,672,706 |
| 7,077,508 | 7,207,654 | 6,935,724 | 6,927,786 | 6,988,787 |
| 6,899,415 | 6,672,708 | 6,644,767 | 6,874,866 | 6,830,316 |
| 6,994,420 | 7,086,720 | 7,240,992 | 7,267,424 | 7,066,578 |
| 7,101,023 | 7,399,063 | 7,159,965 | 7,255,424 | 7,137,686 |
| 7,216,957 | 7,461,923 | 6,916,082 | 6,786,570 | 7,407,261 |
| 6,848,780 | 6,966,633 | 7,179,395 | 6,969,153 | 6,979,075 |
| 7,132,056 | 6,832,828 | 6,860,590 | 6,905,620 | 6,786,574 |
| 6,824,252 | 6,890,059 | 7,246,881 | 7,125,102 | 7,028,474 |
| 7,066,575 | 6,986,202 | 7,044,584 | 7,032,992 | 7,140,720 |
| 7,207,656 | 7,416,275 | 7,008,041 | 7,011,390 | 7,048,868 |
| 7,014,785 | 7,131,717 | 7,331,101 | 7,182,436 | 7,104,631 |
| 7,556,358 | 7,172,265 | 7,284,837 | 7,364,270 | 7,152,949 |
| 7,334,877 | 7,326,357 | 7,566,110 | 7,637,594 | 7,413,671 |
| 7,571,983 | 7,284,326 | 7,284,834 | 6,932,459 | 7,032,997 |
| 6,998,278 | 7,004,563 | 6,938,994 | 7,188,935 | 7,380,339 |
| 7,134,740 | 7,077,588 | 6,918,707 | 6,923,583 | 6,953,295 |
| 6,921,221 | 7,168,167 | 7,337,532 | 7,322,680 | 7,192,120 |
| 7,168,789 | 7,207,657 | 7,152,944 | 7,147,303 | 7,101,020 |
| 7,182,431 | 7,252,367 | 7,374,695 | 6,945,630 | 6,830,395 |
| 6,641,255 | 7,284,833 | 6,666,543 | 6,669,332 | 6,663,225 |
| 7,073,881 | 7,155,823 | 7,219,427 | 7,347,952 | 6,808,253 |
| 6,827,428 | 6,959,982 | 6,959,981 | 6,886,917 | 6,863,378 |
| 7,052,114 | 7,001,007 | 7,008,046 | 6,880,918 | 7,066,574 |
| 7,156,495 | 6,976,751 | 7,175,775 | 7,080,893 | 7,270,492 |
| 7,055,934 | 7,367,729 | 7,419,250 | 7,083,263 | 7,226,147 |
| 7,195,339 | 7,524,032 | 6,350,901 | 7,067,067 | 6,776,476 |
| 6,880,914 | 7,086,709 | 6,783,217 | 7,147,791 | 6,929,352 |
| 6,824,251 | 6,834,939 | 6,840,600 | 6,786,573 | 7,144,519 |
| 6,799,835 | 6,938,991 | 7,226,145 | 7,140,719 | 6,988,788 |
| 7,022,250 | 6,929,350 | 7,004,566 | 7,055,933 | 7,144,098 |
| 7,189,334 | 7,431,429 | 7,147,305 | 7,325,904 | 7,152,960 |
| 7,441,867 | 7,470,003 | 7,401,895 | 7,270,399 | 6,866,369 |
| 6,886,918 | 7,204,582 | 6,921,150 | 6,913,347 | 7,284,836 |
| 7,093,928 | 7,290,856 | 7,086,721 | 7,159,968 | 7,147,307 |
| 7,111,925 | 7,229,154 | 7,341,672 | 7,278,711 | |

BACKGROUND OF THE INVENTION

The present Applicant has described previously a plethora of MEMS inkjet nozzles using thermal bend actuation. Thermal bend actuation generally means bend movement generated by thermal expansion of one material, having a current passing therethough, relative to another material. The resulting bend movement may be used to eject ink from a nozzle opening, optionally via movement of a paddle or vane, which creates a pressure wave in a nozzle chamber.

Some representative types of thermal bend inkjet nozzles are exemplified in the patents and patent applications listed in the cross reference section above, the contents of which are incorporated herein by reference.

The Applicant's U.S. Pat. No. 6,416,167 describes an inkjet nozzle having a paddle positioned in a nozzle chamber and a thermal bend actuator positioned externally of the nozzle chamber. The actuator takes the form of a lower active beam of conductive material (e.g. titanium nitride) fused to an upper passive beam of non-conductive material (e.g. silicon dioxide). The actuator is connected to the paddle via an arm received through a slot in the wall of the nozzle chamber. Upon passing a current through the lower active beam, the actuator bends upwards and, consequently, the paddle moves towards a nozzle opening defined in a roof of the nozzle chamber, thereby ejecting a droplet of ink. An advantage of this design is its simplicity of construction. A drawback of this design is that both faces of the paddle work against the relatively viscous ink inside the nozzle chamber.

The Applicant's U.S. Pat. No. 6,260,953 (assigned to the present Applicant) describes an inkjet nozzle in which the actuator forms a moving roof portion of the nozzle chamber. The actuator is takes the form of a serpentine core of conductive material encased by a polymeric material. Upon actuation, the actuator bends towards a floor of the nozzle chamber, increasing the pressure within the chamber and forcing a droplet of ink from a nozzle opening defined in the roof of the chamber. The nozzle opening is defined in a non-moving portion of the roof. An advantage of this design is that only one face of the moving roof portion has to work against the relatively viscous ink inside the nozzle chamber. A drawback of this design is that construction of the actuator from a serpentine conductive element encased by polymeric material is difficult to achieve in a MEMS process.

The Applicant's U.S. Pat. No. 6,623,101 describes an inkjet nozzle comprising a nozzle chamber with a moveable roof portion having a nozzle opening defined therein. The moveable roof portion is connected via an arm to a thermal bend actuator positioned externally of the nozzle chamber. The actuator takes the form of an upper active beam spaced apart from a lower passive beam. By spacing the active and passive beams apart, thermal bend efficiency is maximized since the passive beam cannot act as heat sink for the active beam. Upon passing a current through the active upper beam, the moveable roof portion, having the nozzle opening defined therein, is caused to rotate towards a floor of the nozzle chamber, thereby ejecting through the nozzle opening. Since the nozzle opening moves with the roof portion, drop flight direction may be controlled by suitable modification of the shape of the nozzle rim. An advantage of this design is that only one face of the moving roof portion has to work against the relatively viscous ink inside the nozzle chamber. A further advantage is the minimal thermal losses achieved by spacing apart the active and passive beam members. A drawback of this design is the loss of structural rigidity in spacing apart the active and passive beam members.

There is a need to improve upon the design of thermal bend inkjet nozzles, so as to achieve more efficient drop ejection and improved mechanical robustness.

SUMMARY OF THE INVENTION

DETAILED DESCRIPTION OF THE INVENTION

Thermoelastic Active Element Comprised of Aluminium Alloy

Typically, a MEMS thermal bend actuator (or thermoelastic actuator) comprises a pair of elements in the form of an active element and a passive element, which constrains linear expansion of the active element. The active element is required to undergo greater thermoelastic expansion relative to the passive element, thereby providing a bending motion. The elements may be fused or bonded together for maximum structural integrity or spaced apart for minimizing thermal losses to the passive element.

Hitherto, we described titanium nitride as being a suitable candidate for an active thermoelastic element in a thermal bend actuator (see, for example, U.S. Pat. No. 6,416,167). Other suitable materials described in, for example, Applicant's U.S. Pat. No. 6,428,133 are $TiB_2$, $MoSi_2$ and TiAlN.

In terms of its high thermal expansion and low density, aluminium is strong candidate for use as an active thermoelastic element. However, aluminum suffers from a relatively low Young's modulus, which detracts from its overall thermoelastic efficiency. Accordingly, aluminium had previously been disregarded as a suitable material for use an active thermoelastic element.

However, it has now been found that aluminium alloys are excellent materials for use as thermoelastic active elements, since they combine the advantageous properties of high thermal expansion, low density and high Young's modulus.

Typically, aluminium is alloyed with at least one metal having a Young's modulus of >100 GPa. Typically, aluminium is alloyed with at least one metal selected from the group comprising: vanadium, manganese, chromium, cobalt and nickel. Surprisingly, it has been found that the excellent thermal expansion properties of aluminium are not compromised when alloyed with such metals.

Optionally, the alloy comprises at least 60%, optionally at least 70%, optionally at least 80% or optionally at least 90% aluminium.

Figure 1:
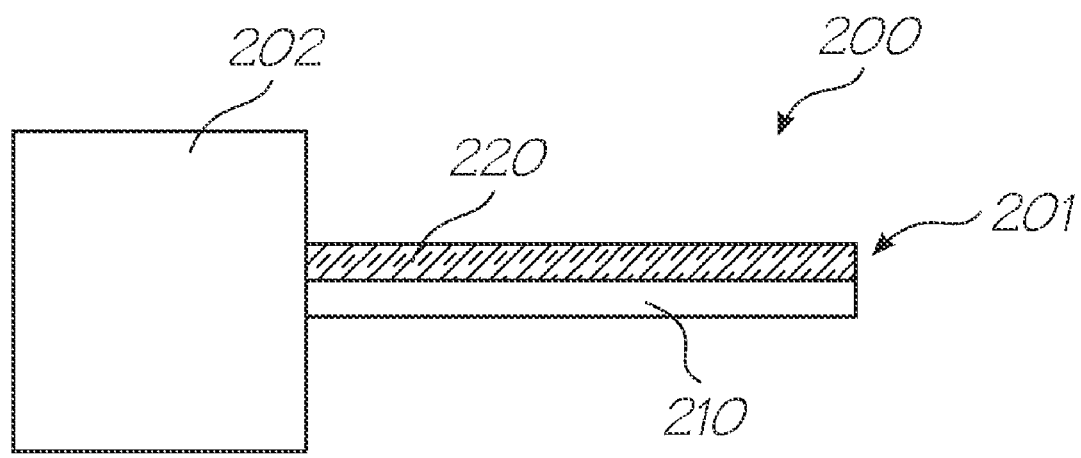
FIG. 1 is a schematic side view of a bi-layered thermal bend actuator comprising an active beam and a passive beam.

FIG. 1 shows a bimorph thermal bend actuator 200 in the form of a cantilever beam 201 fixed to a post 202. The cantilever beam 201 comprises a lower active beam 210 bonded to an upper passive beam 220. The thermoelastic efficiencies of the actuator 200 were compared for active beams comprised of: (i) 100% Al; (ii) 95% Al/5% V; and (iii) 90% Al/10% V. The upper passive beam 220 was formed of silicon dioxide in each case.

Thermoelastic efficiencies were compared by stimulating the active beam 210 with a short electrical pulse and measuring the energy required to establish a peak oscillatory velocity of 3 m/s, as determined by a laser interferometer. The results are shown in the Table below:

| Active Beam Material | Energy Required to Reach Peak Oscillatory Velocity |
| --- | --- |
| 100% Al | 466 nJ |
| 95% Al/5% V | 224 nJ |
| 90% Al/10% V | 219 nJ |

Thus, the 95% Al/5% V alloy required 2.08 times less energy than the comparable 100% Al device. Further, the 90% Al/10% V alloy required 2.12 times less energy than the comparable 100% Al device. It was therefore concluded that aluminium alloys are excellent candidates for use as active thermoelastic elements in a range of MEMS applications, including thermal bend actuators for inkjet nozzles.

Passive Element Comprising Negative CTE Material

Typically, the passive element of a MEMS thermal bend actuator is formed of silicon dioxide. Silicon dioxide has low thermal expansion relative to the active element and so bending results when the active element is heated.

Recently, there have been described materials, such as cubic zirconium tungstate, having negative thermal expansion characteristics i.e. the material contracts on heating. Such materials are excellent candidates for use in thermal bend actuators, because the amount of deflection is directly related to the difference in expansion between the active and passive elements. Hence, the operational efficiency of a thermal bend actuator device may be improved using a material having negative thermal expansion as the passive element.

Referring again to FIG. 1, the lower active beam element 210 may be formed of a material having a positive cte (e.g. titanium aluminium nitride), whilst the upper passive beam may be formed of a material having a negative cte (e.g. zirconium tungstate). Hence, the bimorph thermal bend actuator 200 has excellent operational efficiency due to the high cte difference between the active and passive beam elements.

An additional advantage of this arrangement is that there is no need to space apart the active and passive elements to improve bend efficiency, since any heating of the passive element by the active element only serves to generate greater deflections. Accordingly, bend efficiency can be improved without compromising the structural integrity of the actuator or modifying the basic bimorph design of the actuator.

Any suitable material having negative thermal expansion may be used as the passive beam. Typically, such materials have cubic structures and are of formula: $AM_2O_8$, wherein A=Zr or Hf, and M=Mo or W.

Thermal bend actuators having a negative cte passive element may be used in a range of MEMS devices, such as the inkjet nozzles described herein and elsewhere. Such devices advantageously exhibit improved operational efficiency.

Inkjet Nozzles Comprising a Thermal Bend Actuator

There now follows a description of typical inkjet nozzles, which may incorporate a thermal bend actuator having an active element comprised of aluminium alloy.

Nozzle Assembly Comprising Fused Thermal Bend Actuator

Figure 2A:
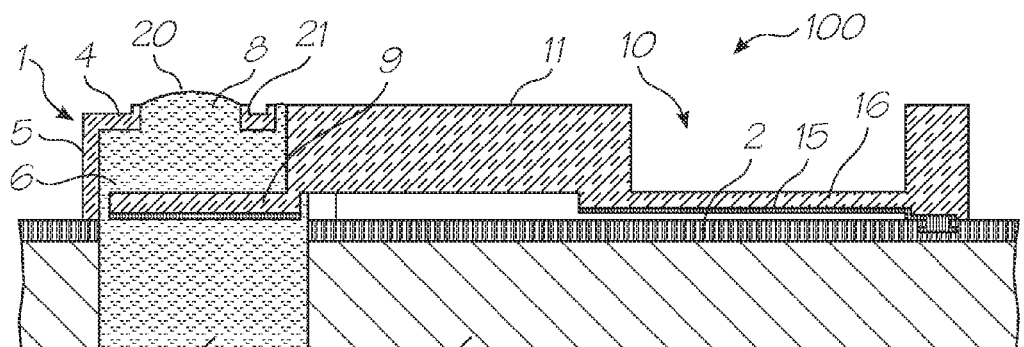
FIGS. 2(A)-(C) are schematic side sectional views of an inkjet nozzle assembly comprising a fused thermal bend actuator at various stages of operation.
Figure 3:
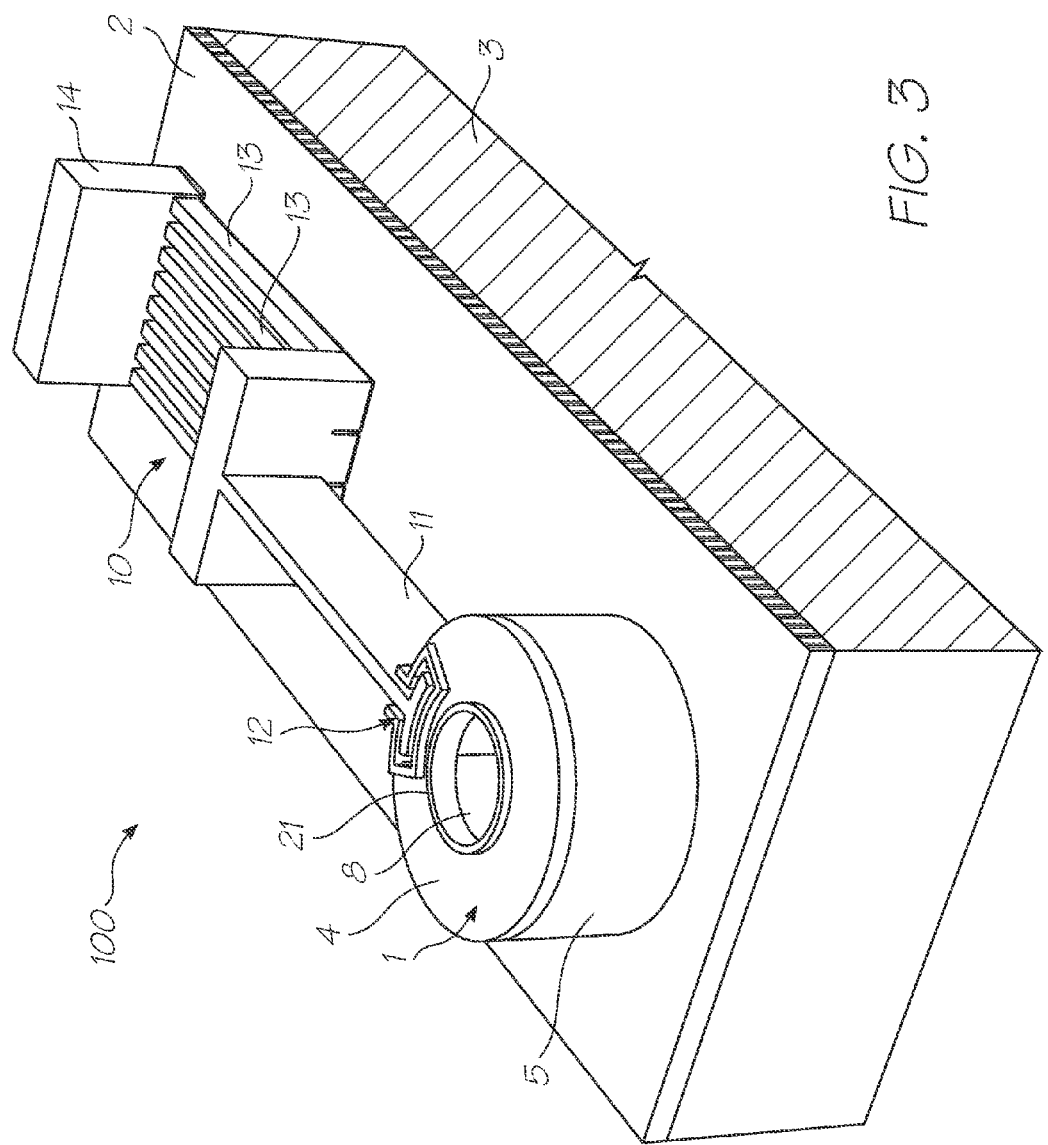
FIG. 3 is a perspective view of the nozzle assembly shown in FIG. 2(A)

Turning initially to FIGS. 2(A) and 3, there are shown schematic illustrations of a nozzle assembly 100 according to a first embodiment. The nozzle assembly 100 is formed by MEMS processes on a passivation layer 2 of a silicon substrate 3, as described in U.S. Pat. No. 6,416,167. The nozzle assembly 100 comprises a nozzle chamber 1 having a roof 4 and sidewall 5. The nozzle chamber 1 is filled with ink 6 by means of an ink inlet channel 7 etched through the substrate 3. The nozzle chamber 1 further includes a nozzle opening 8 for ejection of ink from the nozzle chamber. An ink meniscus 20 is pinned across a rim 21 of the nozzle opening 8, as shown in FIG. 2(A).

The nozzle assembly 100 further comprises a paddle 9, positioned inside the nozzle chamber 1, which is interconnected via an arm 11 to an actuator 10 positioned externally of the nozzle chamber. As shown more clearly in FIG. 2, the arm extends through a slot 12 in nozzle chamber 1. Surface tension of ink within the slot 12 is sufficient to provide a fluidic seal for ink contained in the nozzle chamber 1.

The actuator 10 comprises a plurality of elongate actuator units 13, which are spaced apart transversely. Each actuator unit extends between a fixed post 14, which is mounted on the passivation layer 2, and the arm 11. Hence, the post 14 provides a pivot for the bending motion of the actuator 10.

Each actuator unit 13 comprises a first active beam 15 and a second passive beam 16 fused to an upper face of the active beam. The active beam 15 is conductive and connected to drive circuitry in a CMOS layer of the substrate 3. The passive beam 16 is typically non-conductive.

Figure 2B:
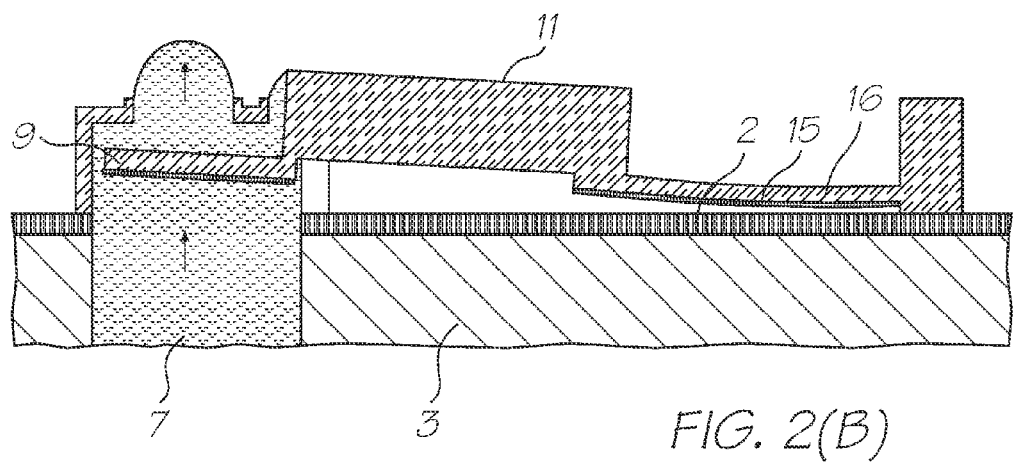

Referring now to FIG. 2(B), when current flows through the active beam 15, it is heated and undergoes thermal expansion relative to the passive beam 16. This causes upward bending movement of the actuator 10, which is magnified into a rotational movement of the paddle 9.

This consequential paddle movement causes a general increase in pressure around the ink meniscus 20 which expands, as illustrated in FIG. 1(B), in a rapid manner. Subsequently the actuator is deactivated, which causes the paddle 9 to return to its quiescent position (FIG. 2(C)).

Figure 2C:
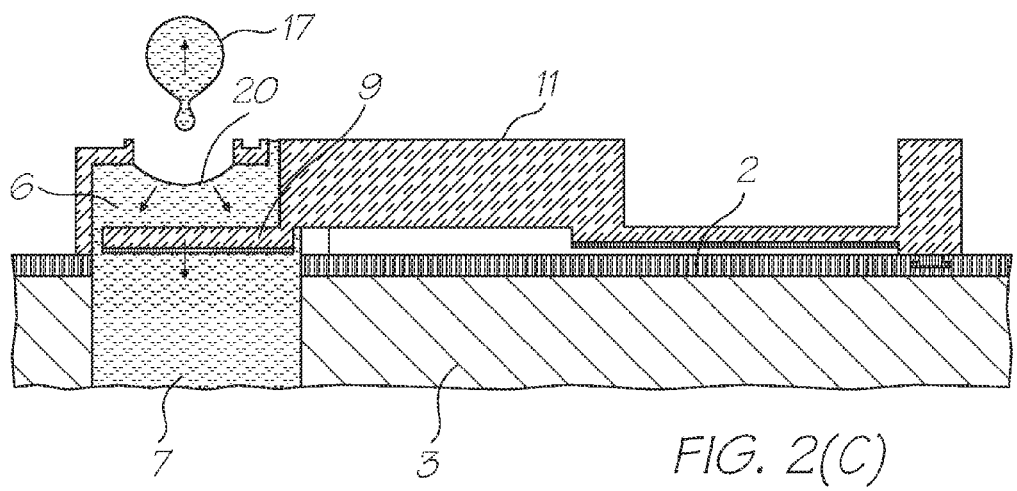

During this pulsing cycle, a droplet of ink 17 is ejected from the nozzle opening 8 and at the same time ink 6 reflows into the nozzle chamber 1 via the ink inlet 7. The forward momentum of the ink outside the nozzle rim 21 and the corresponding backflow results in a general necking and breaking off of the droplet 17 which proceeds towards a print medium, as shown in FIG. 2(C). The collapsed meniscus 20 causes ink 6 to be sucked into the nozzle chamber 1 via the ink inlet 7. The nozzle chamber 1 is refilled such that the position in FIG. 2(A) is again reached and the nozzle assembly 100 is ready for the ejection of another droplet of ink.

Turning to FIG. 3, it will be seen that the actuator units 13 are tapered with respect to their transverse axes, having a narrower end connected to the post 14 and a wider end connected to the arm 11. This tapering ensures that maximum resistive heating takes place near the post 14, thereby maximizing the thermoelastic bending motion.

Figure 4:
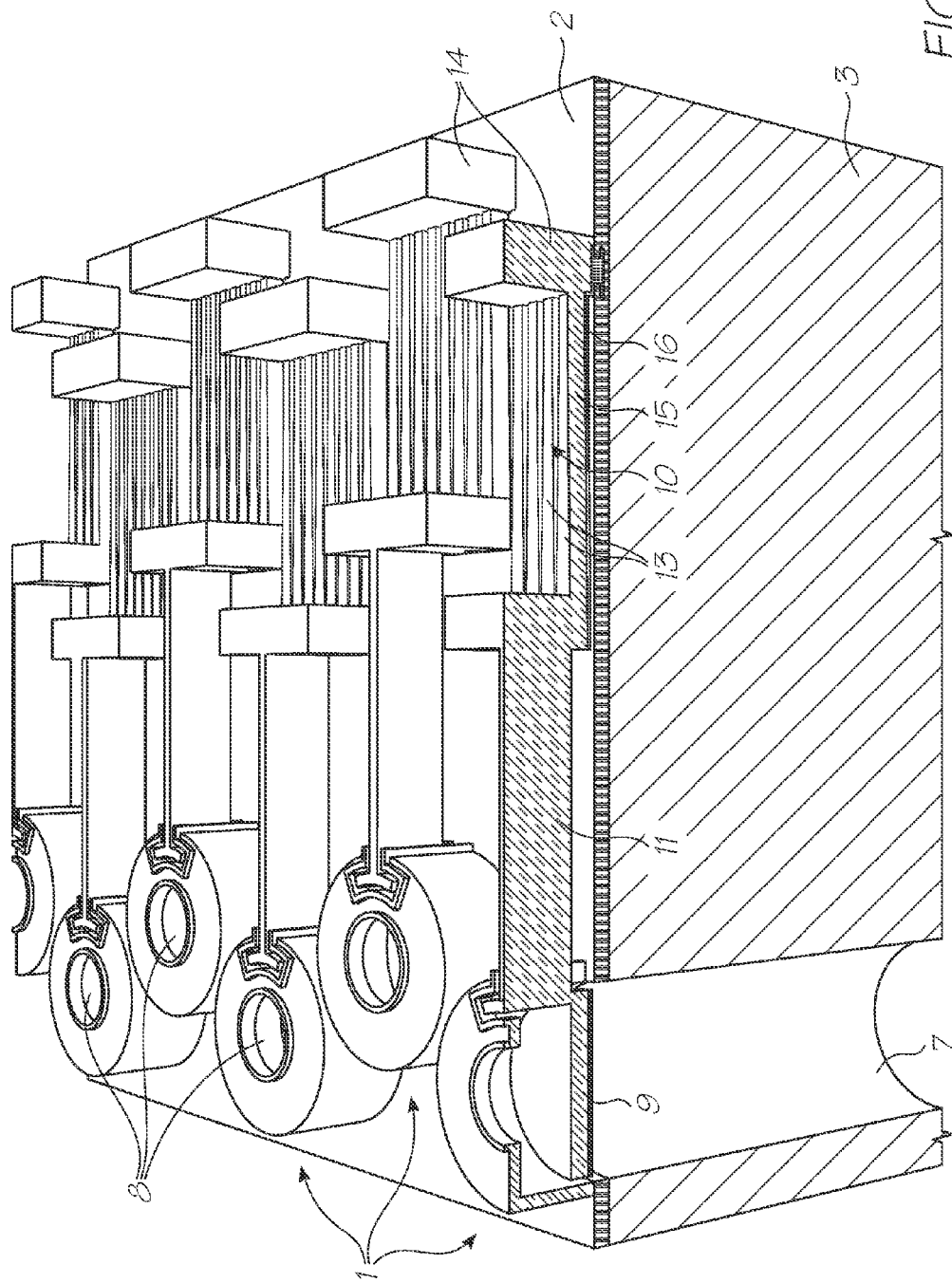
FIG. 4 is a perspective view of part of a printhead integrated circuit comprising an array of nozzle assemblies, as shown in FIGS. 2(A) and 3.

Typically, the passive beam 16 is comprised of silicon dioxide or TEOS deposited by CVD. As shown in the FIGS. 2 to 4, the arm 11 is formed from the same material. However, the passive beam 16 may advantageously be comprised of a material having negative thermal expansion, in accordance with the present invention.

Nozzle Assembly Comprising Spaced Apart Thermal Bend Actuator

Figure 5:
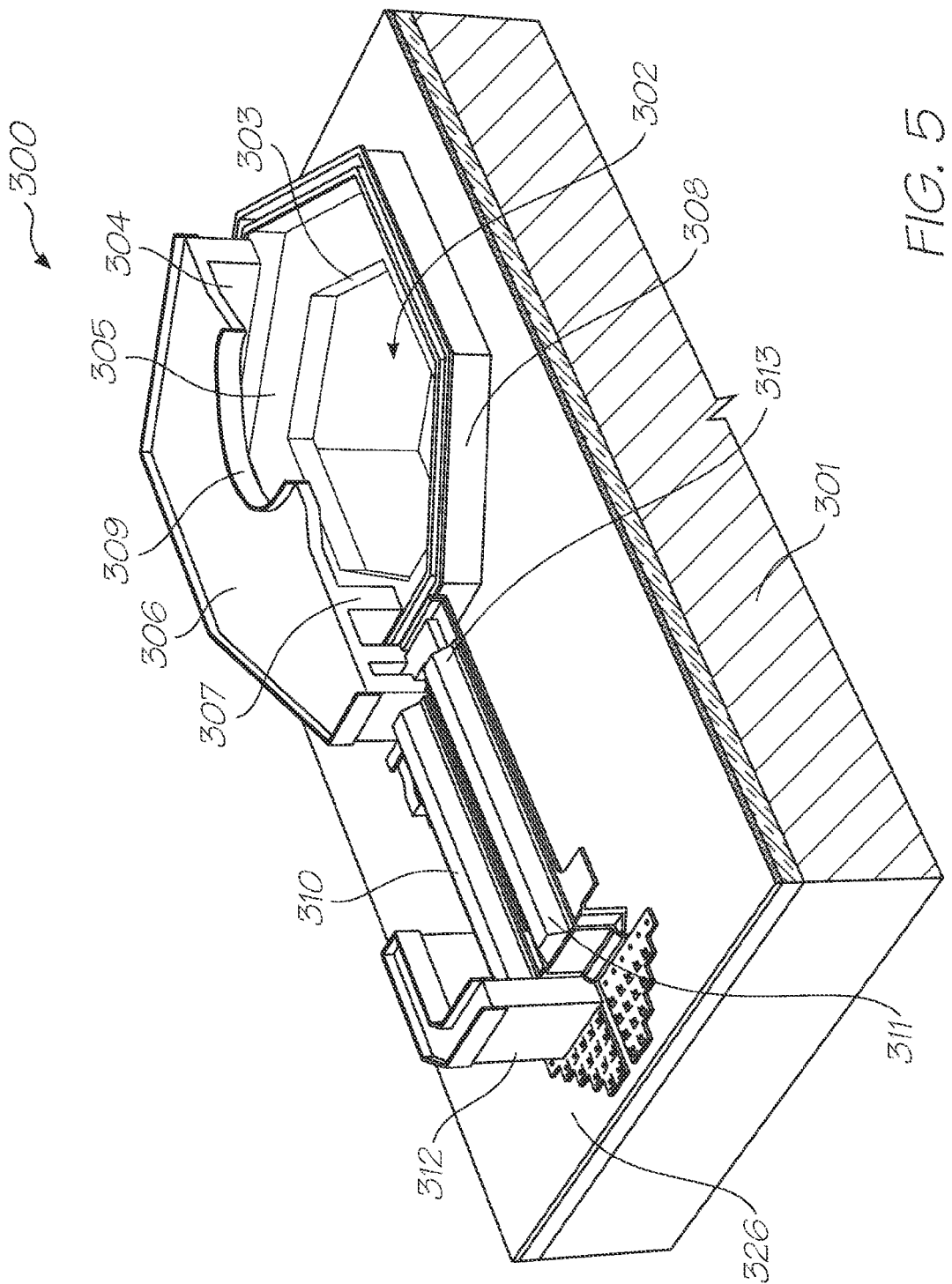
FIG. 5 is a cutaway perspective view of an inkjet nozzle assembly comprising a spaced apart thermal bend actuator and moving roof structure.
Figure 6:
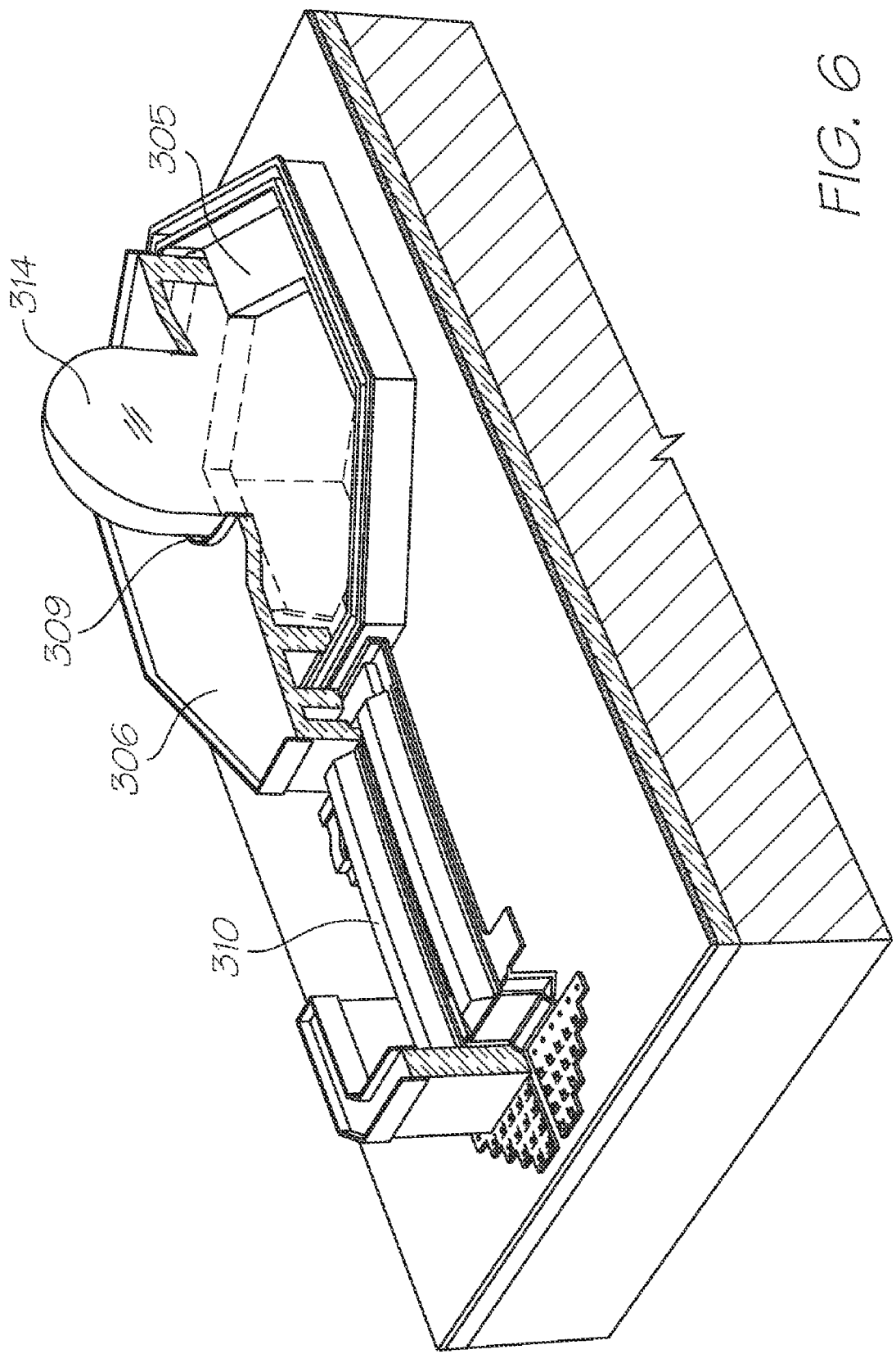
FIG. 6 is a cutaway perspective view of the inkjet nozzle assembly shown in FIG. 5 in an actuated configuration.
Figure 7:
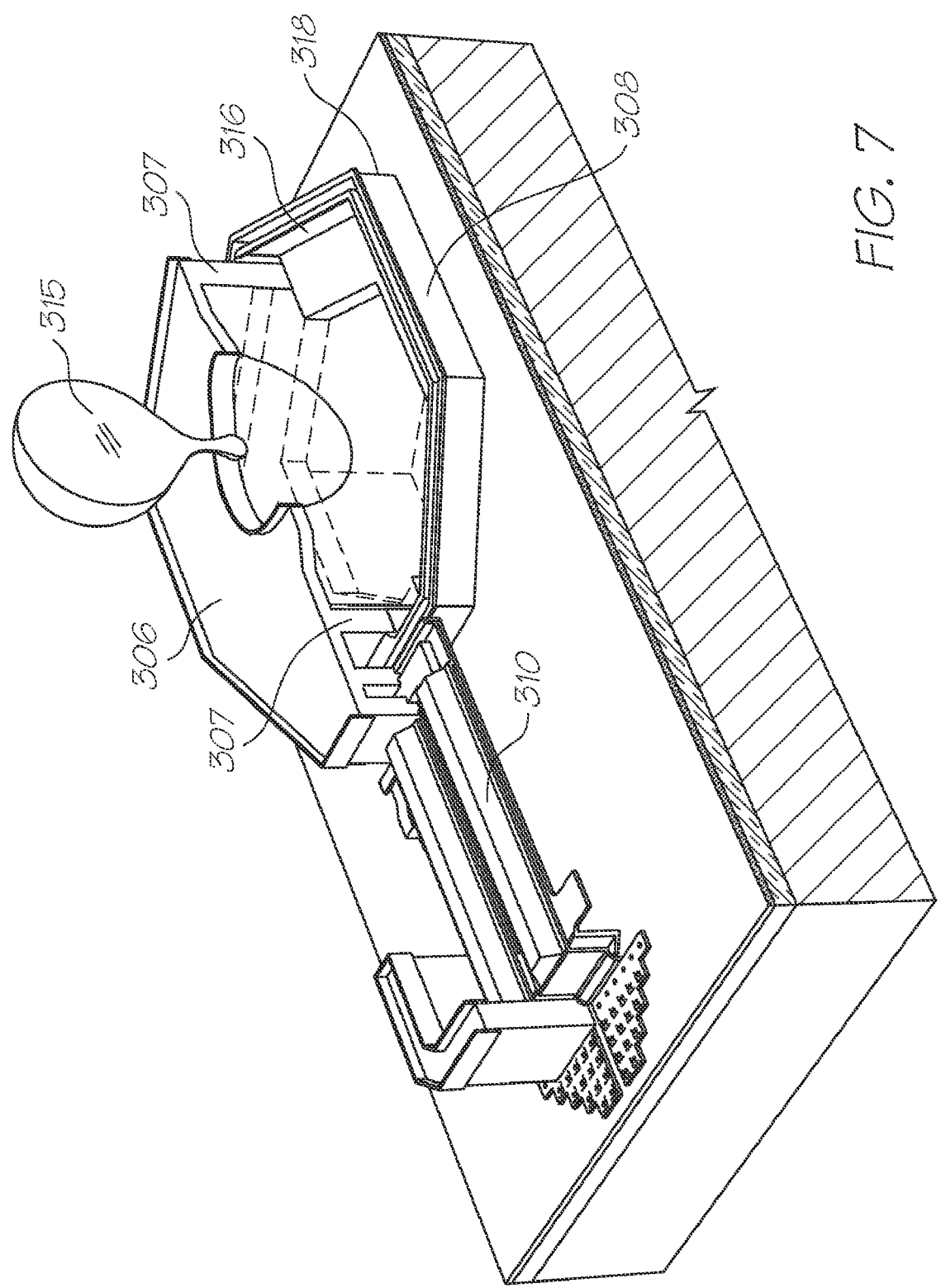
FIG. 7 is a cutaway perspective view of the inkjet nozzle assembly shown in FIG. 5 immediately after de-actuation.

Turning now to FIGS. 5 to 8, there is shown a nozzle assembly 300, in accordance with a second embodiment. Referring to FIGS. 5 to 7 of the accompanying drawings, the nozzle assembly 300 is constructed (by way of MEMS technology) on a substrate 301 defining an ink supply aperture 302 opening through a hexagonal inlet 303 (which could be of any other suitable configuration) into a chamber 304. The chamber is defined by a floor portion 305, roof portion 306 and peripheral sidewalls 307 and 308 which overlap in a telescopic manner. The sidewalls 307, depending downwardly from roof portion 306, are sized to be able to move upwardly and downwardly within sidewalls 308 which depend upwardly from floor portion 305.

The ejection nozzle is formed by rim 309 located in the roof portion 306 so as to define an opening for the ejection of ink from the nozzle chamber as will be described further below.

The roof portion 306 and downwardly depending sidewalls 307 are supported by a bend actuator 310 typically made up of layers forming a Joule heated cantilever which is constrained by a non-heated cantilever, so that heating of the Joule heated cantilever causes a differential expansion between the Joule heated cantilever and the non-heated cantilever causing the bend actuator 310 to bend.

The proximal end 311 of the bend actuator is fastened to the substrate 301, and prevented from moving backwards by an anchor member 312 which will be described further below, and the distal end 313 is secured to, and supports, the roof portion 306 and sidewalls 307 of the ink jet nozzle.

In use, ink is supplied into the nozzle chamber through passage 302 and opening 303 in any suitable manner, but typically as described in our previously referenced co-pending patent applications. When it is desired to eject a drop of ink from the nozzle chamber, an electric current is supplied to the bend actuator 310 causing the actuator to bend to the position shown in FIG. 6 and move the roof portion 306 downwardly toward the floor portion 305. This relative movement decreases the volume of the nozzle chamber, causing ink to bulge upwardly through the nozzle rim 309 as shown at 314 (FIG. 6) where it is formed to a droplet by the surface tension in the ink.

As the electric current is withdrawn from the bend actuator 310, the actuator reverts to the straight configuration as shown in FIG. 7 moving the roof portion 306 of the nozzle chamber upwardly to the original location. The momentum of the partially formed ink droplet 314 causes the droplet to continue to move upwardly forming an ink drop 315 as shown in FIG. 7 which is projected on to the adjacent paper surface or other article to be printed.

In one form of the invention, the opening 303 in floor portion 305 is relatively large compared with the cross-section of the nozzle chamber and the ink droplet is caused to be ejected through the nozzle rim 309 upon downward movement of the roof portion 306 by viscous drag in the sidewalls of the aperture 302, and in the supply conduits leading from the ink reservoir (not shown) to the opening 302.

Figure 8:
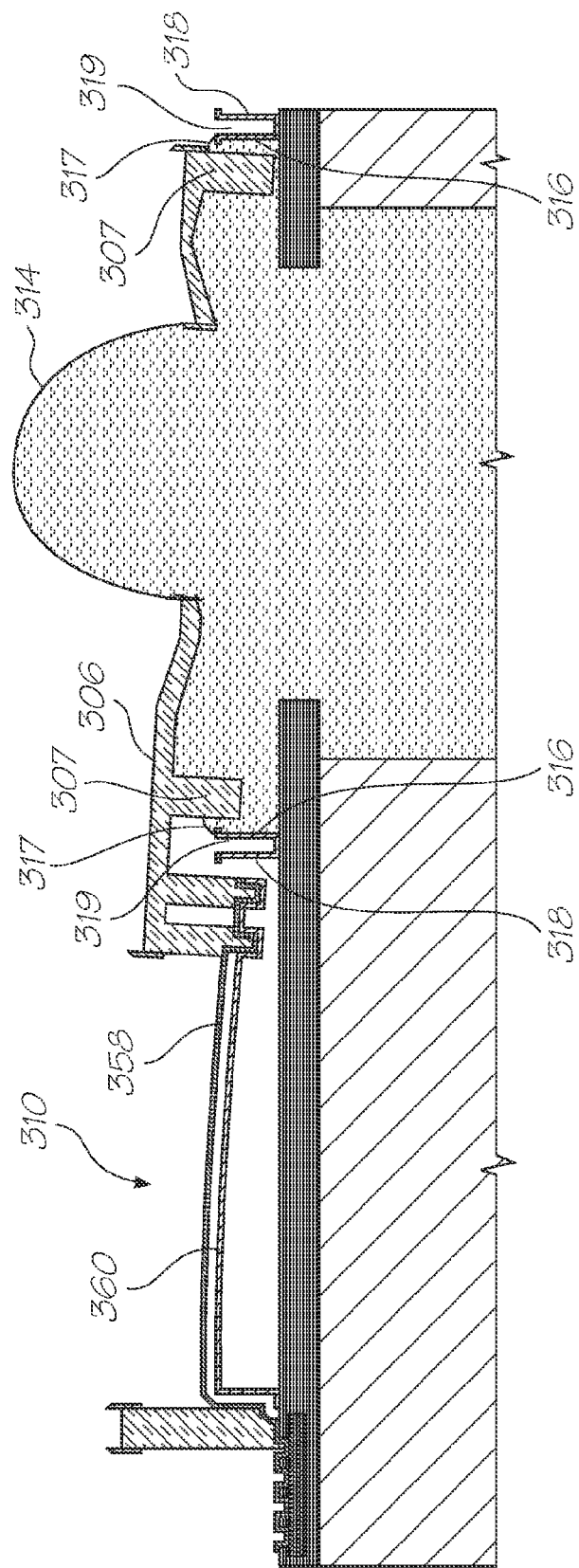
FIG. 8 is a side sectional view of the nozzle assembly shown in FIG. 6.

In order to prevent ink leaking from the nozzle chamber during actuation ie. during bending of the bend actuator 310, a fluidic seal is formed between sidewalls 307 and 308 as will now be further described with specific reference to FIGS. 7 and 8.

The ink is retained in the nozzle chamber during relative movement of the roof portion 306 and floor portion 305 by the geometric features of the sidewalls 307 and 308 which ensure that ink is retained within the nozzle chamber by surface tension. To this end, there is provided a very fine gap between downwardly depending sidewall 307 and the mutually facing surface 316 of the upwardly depending sidewall 308. As can be clearly seen in FIG. 8 the ink (shown as a dark shaded area) is restrained within the small aperture between the downwardly depending sidewall 307 and inward faces 316 of the upwardly extending sidewall by the proximity of the two sidewalls which ensures that the ink "self seals" across free opening 317 by surface tension, due to the close proximity of the sidewalls.

In order to make provision for any ink which may escape the surface tension restraint due to impurities or other factors which may break the surface tension, the upwardly depending sidewall 308 is provided in the form of an upwardly facing channel having not only the inner surface 316 but a spaced apart parallel outer surface 18 forming a U-shaped channel 319 between the two surfaces. Any ink drops escaping from the surface tension between the surfaces 307 and 316, overflows into the U-shaped channel where it is retained rather than "wicking" across the surface of the nozzle strata. In this manner, a dual wall fluidic seal is formed which is effective in retaining the ink within the moving nozzle mechanism.

Referring to FIG. 8, it will been seen that the actuator 310 is comprised of a first, active beam 358 arranged above and spaced apart from a second, passive beam 360. By spacing apart the two beams, thermal transfer from the active beam 358 to the passive beam 360 is minimized Accordingly, this spaced apart arrangement has the advantage of maximizing thermoelastic efficiency. In the present invention, the active beam 358 may be comprised of an aluminium alloy, as described above, such as aluminium-vanadium alloy.

Thermal Bend Actuator Defining Moving Nozzle Roof

The embodiments exemplified by FIGS. 5 to 8 showed a nozzle assembly 300 comprising a nozzle chamber 304 having a roof portion 306 which moves relative to a floor portion 305 of the chamber. The moveable roof portion 306 is actuated to move towards the floor portion 305 by means of a bi-layered thermal bend actuator 310 positioned externally of the nozzle chamber 305.

A moving roof lowers the drop ejection energy, since only one face of the moving structure has to do work against the viscous ink. However, there is still a need to increase the amount of power available for drop ejection. By increasing the amount of power, a shorter pulse width can be used to provide the same amount of energy. With shorter pulse widths, improved drop ejection characteristics can be achieved.

One means for increasing actuator power is to increase the size of the actuator. However, in the nozzle design shown in FIGS. 5 to 8, it is apparent that an increase in actuator size would adversely affect nozzle spacing, which is undesirable in the manufacture of high-resolution pagewidth printheads.

A solution to this problem is provided by the nozzle assembly 400 shown in FIGS. 9 to 12. The nozzle assembly 400 comprises a nozzle chamber 401 formed on a passivated CMOS layer 402 of a silicon substrate 403. The nozzle chamber is defined by a roof 404 and sidewalls 405 extending from the roof to the passivated CMOS layer 402. Ink is supplied to the nozzle chamber 401 by means of an ink inlet 406 in fluid communication with an ink supply channel 407 receiving ink from backside of the silicon substrate. Ink is ejected from the nozzle chamber 401 by means of a nozzle opening 408 defined in the roof 404. The nozzle opening 408 is offset from the ink inlet 406.

Figure 9:
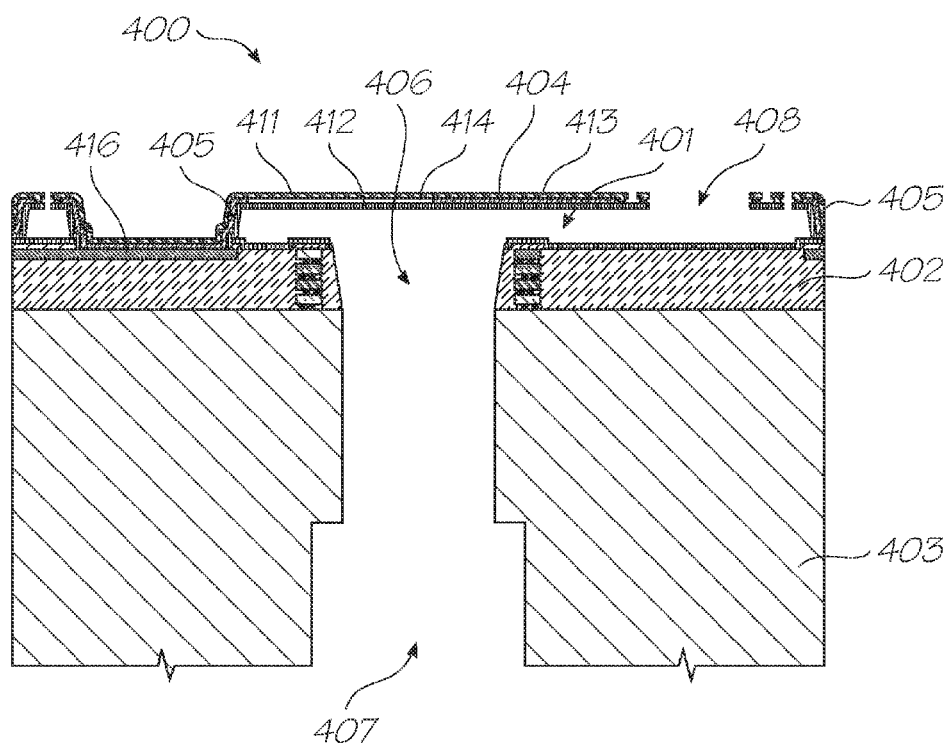
FIG. 9 is a side sectional view of an inkjet nozzle assembly comprising a roof having a moving portion defined by a thermal bend actuator.
Figure 10:
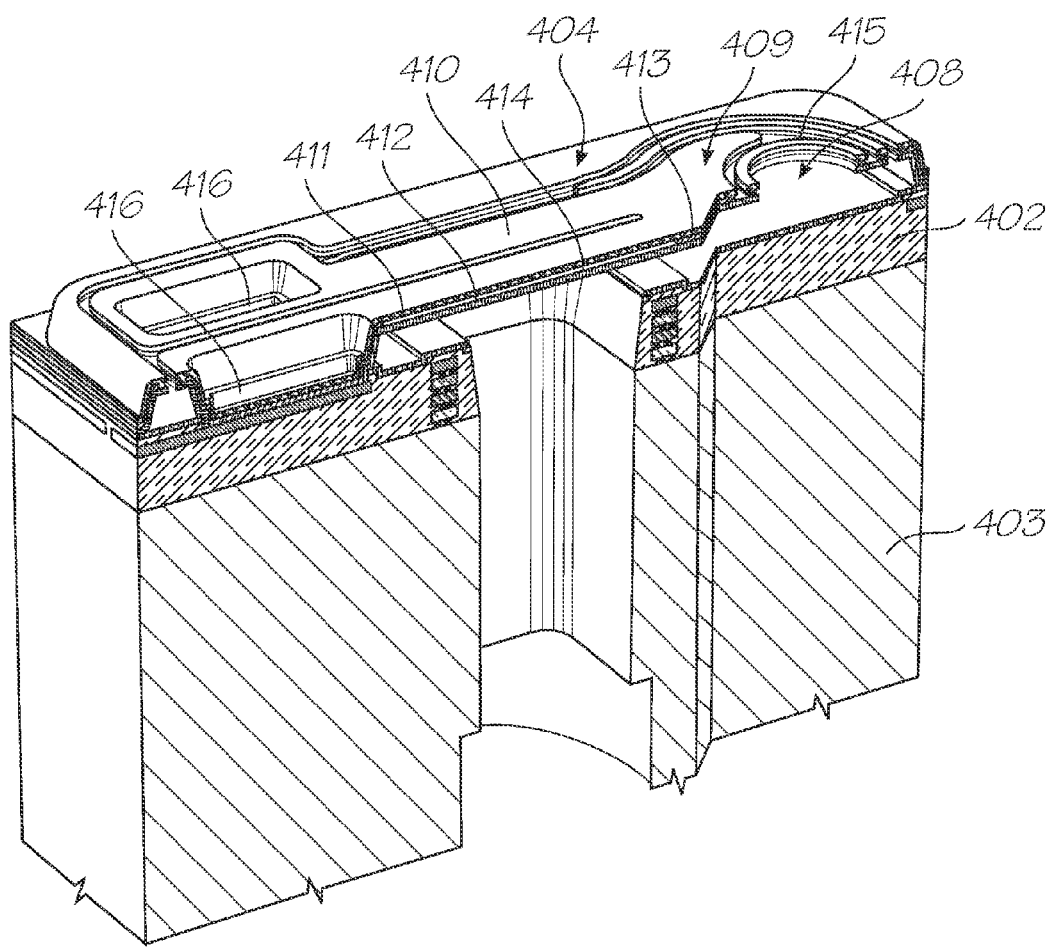
FIG. 10 is a cutaway perspective view of the nozzle assembly shown in FIG. 9.

As shown more clearly in FIG. 10, the roof 404 has a moving portion 409, which defines a substantial part of the total area of the roof. Typically, the moving portion 409 defines at least 20%, at least 30%, at least 40% or at least 50% of the total area of the roof 404. In the embodiment shown in FIGS. 9 to 12, the nozzle opening 408 and nozzle rim 415 are defined in the moving portion 409, such that the nozzle opening and nozzle rim move with the moving portion.

The nozzle assembly 400 is characterized in that the moving portion 409 is defined by a thermal bend actuator 410 having a planar upper active beam 411 and a planar lower passive beam 412. Hence, the actuator 410 typically defines at least 20%, at least 30%, at least 40% or at least 50% of the total area of the roof 404. Correspondingly, the upper active beam 411 typically defines at least 20%, at least 30%, at least 40% or at least 50% of the total area of the roof 404.

As shown in FIGS. 9 and 10, at least part of the upper active beam 411 is spaced apart from the lower passive beam 412 for maximizing thermal insulation of the two beams. More specifically, a layer of Ti is used as a bridging layer 413 between the upper active beam 411 comprised of TiN and the lower passive beam 412 comprised of $SiO_2$. The bridging layer 413 allows a gap 414 to be defined in the actuator 410 between the active and passive beams. This gap 414 improves the overall efficiency of the actuator 410 by minimizing thermal transfer from the active beam 411 to the passive beam 412.

However, it will of course be appreciated that the active beam 411 may, alternatively, be fused or bonded directly to the passive beam 412 for improved structural rigidity. Such design modifications would be well within the ambit of the skilled person and are encompassed within the scope of the present invention. In the case of fused or bonded arrangements, the passive beam 412 may advantageously be comprised of a material having negative thermal expansion.

The active beam 411 is connected to a pair of contacts 416 (positive and ground) via the Ti bridging layer. The contacts 416 connect with drive circuitry in the CMOS layers.

When it is required to eject a droplet of ink from the nozzle chamber 401, a current flows through the active beam 411 between the two contacts 416. The active beam 411 is rapidly heated by the current and expands relative to the passive beam 412, thereby causing the actuator 410 (which defines the moving portion 409 of the roof 404) to bend downwards towards the substrate 403. This movement of the actuator 410 causes ejection of ink from the nozzle opening 408 by a rapid increase of pressure inside the nozzle chamber 401. When current stops flowing, the moving portion 409 of the roof 404 is allowed to return to its quiescent position, which sucks ink from the inlet 406 into the nozzle chamber 401, in readiness for the next ejection.

Accordingly, the principle of ink droplet ejection is analogous to that described above in connection with nozzle assembly 300. However, with the thermal bend actuator 410 defining the moving portion 409 of the roof 404, a much greater amount of power is made available for droplet ejection, because the active beam 411 has a large area compared with the overall size of the nozzle assembly 400.

Figure 12:
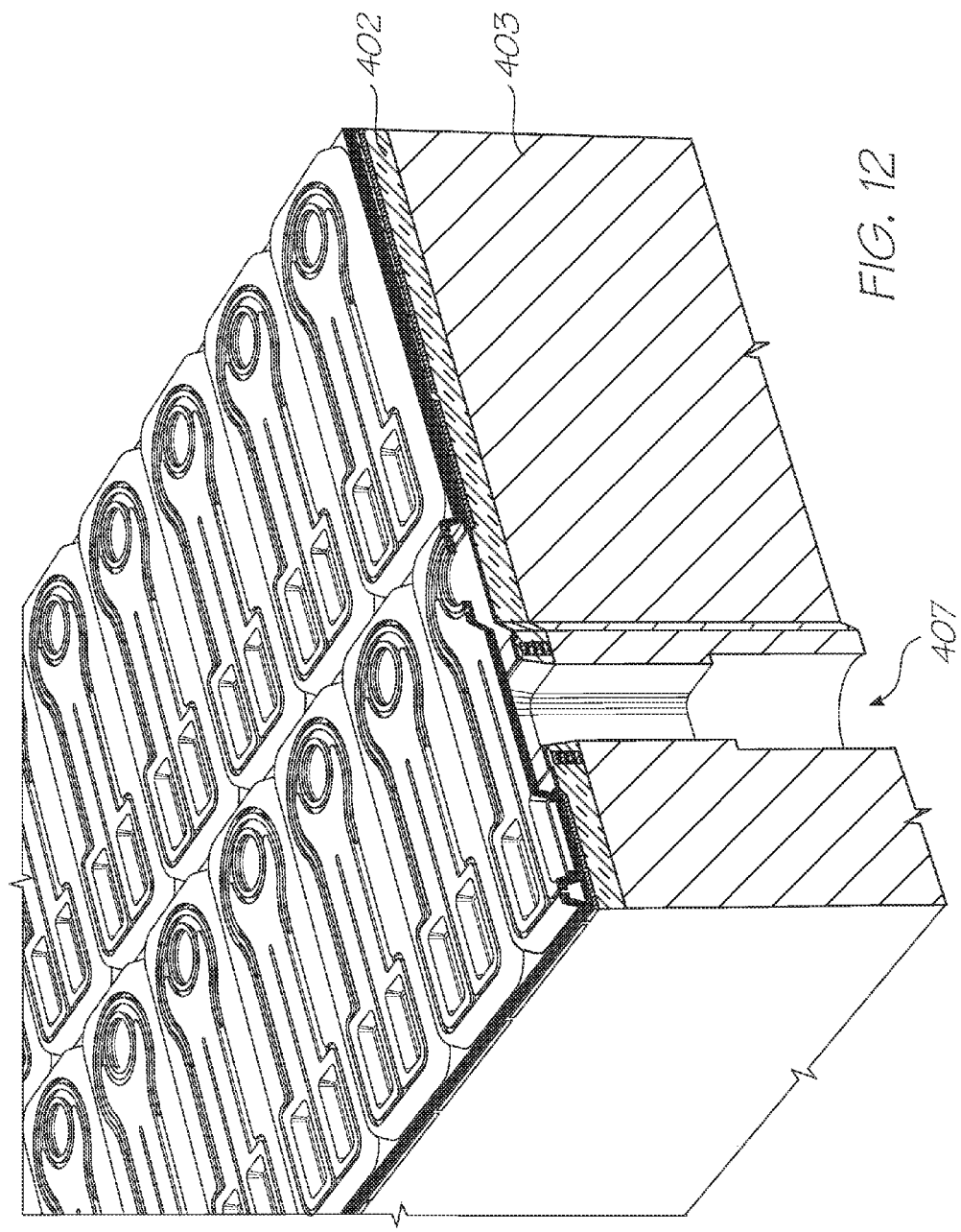
FIG. 12 is a cutaway perspective view of an array of the nozzle assemblies shown in FIG. 10.

Turning to FIG. 12, it will be readily appreciated that the nozzle assembly 400 (as well as all other nozzle assemblies described herein) may be replicated into an array of nozzle assemblies to define a printhead or printhead integrated circuit. A printhead integrated circuit comprises a silicon substrate, an array of nozzle assemblies (typically arranged in rows) formed on the substrate, and drive circuitry for the nozzle assemblies. A plurality of printhead integrated circuits may be abutted or linked to form a pagewidth inkjet printhead, as described in, for example, Applicant's earlier U.S. application Ser. Nos. 10/854,491 filed on May 27, 2004 and 11/014,732 filed on Dec. 20, 2004, the contents of which are herein incorporated by reference.

Figure 14:
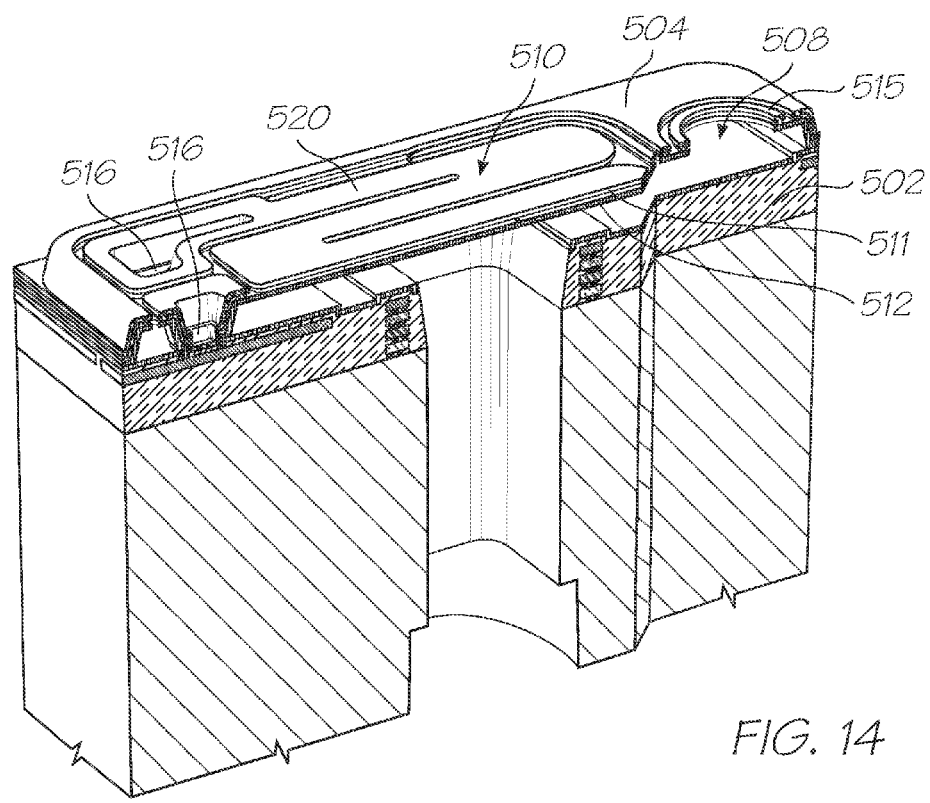
FIG. 14 is a cutaway perspective view of the nozzle assembly shown in FIG. 13.
Figure 13:
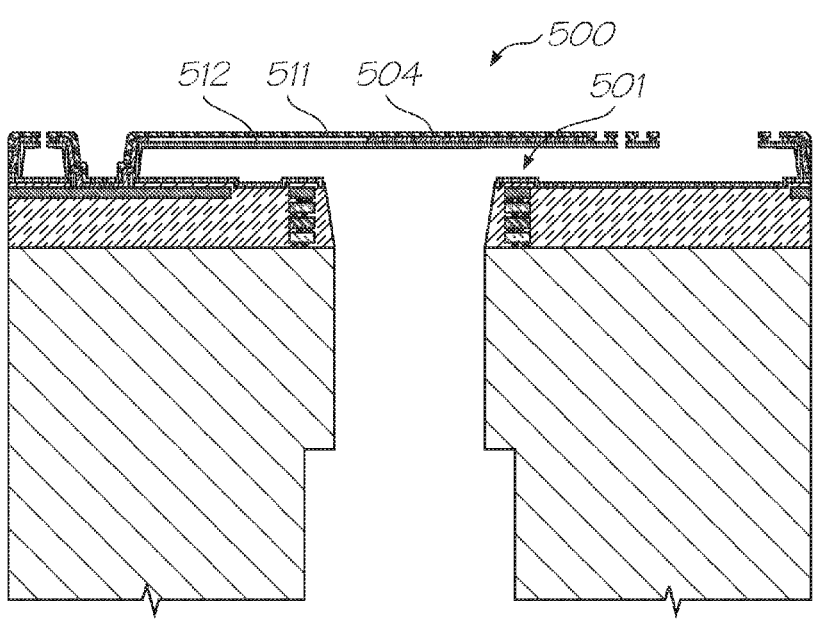
FIG. 13 is a side sectional view of an alternative inkjet nozzle assembly comprising a roof having a moving portion defined by a thermal bend actuator.
Figure 15:
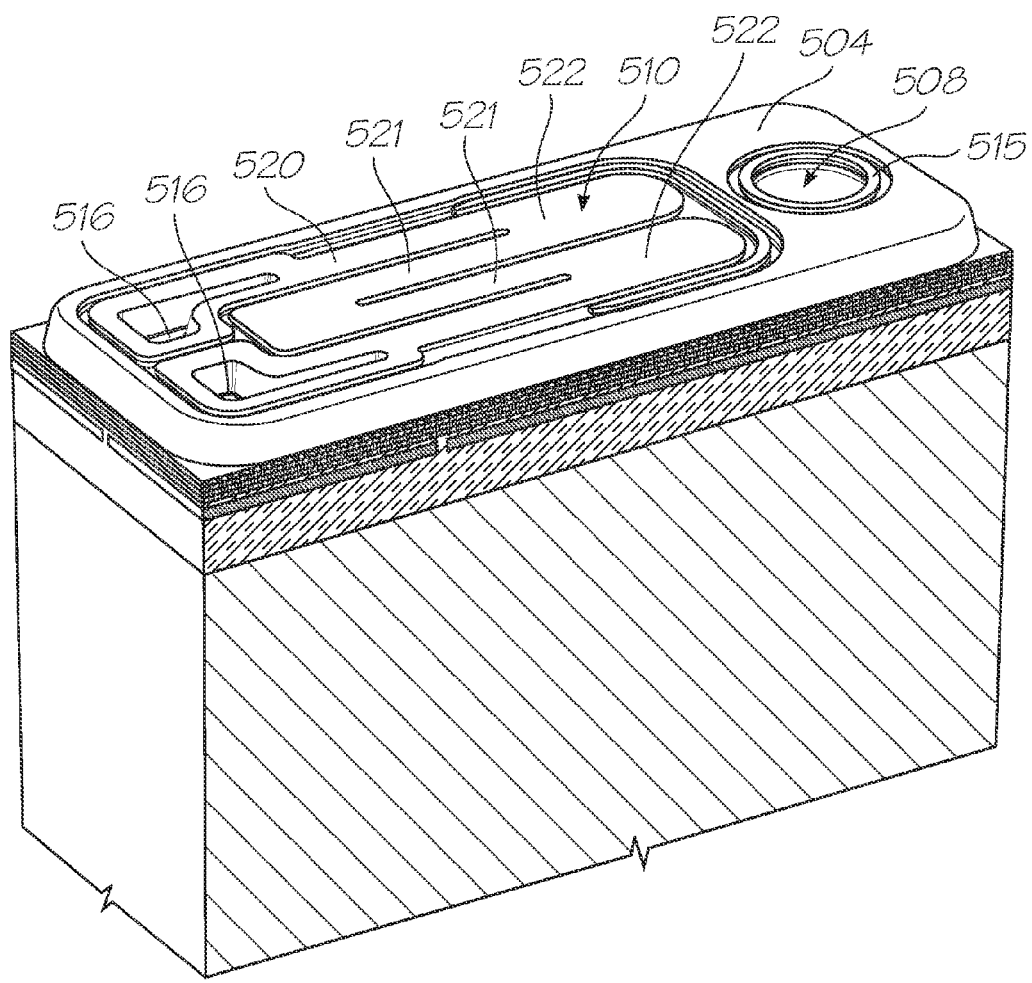
FIG. 15 is a perspective view of the nozzle assembly shown in FIG. 13.

The nozzle assembly 500 shown in FIGS. 13 to 15 is similar to the nozzle assembly 400 insofar as a thermal bend actuator 510, having an upper active beam 511 and a lower passive beam 512, defines a moving portion of a roof 504 of the nozzle chamber 501. Hence, the nozzle assembly 500 achieves the same advantages, in terms of increased power, as the nozzle assembly 400.

However, in contrast with the nozzle assembly 400, the nozzle opening 508 and rim 515 are not defined by the moving portion of the roof 504. Rather, the nozzle opening 508 and rim 515 are defined in a fixed portion of the roof 504 such that the actuator 510 moves independently of the nozzle opening and rim during droplet ejection. An advantage of this arrangement is that it provides more facile control of drop flight direction.

It will of course be appreciated that the negative cte materials (e.g. cubic zirconium tungstate), with their inherent advantages, may be used as the passive beam in either of the thermal bend actuators 410 and 510 described above in connection with the embodiments shown in FIGS. 9 to 15.

The nozzle assemblies 400 and 500 may be constructed using suitable MEMS technologies in an analogous manner to inkjet nozzle manufacturing processes exemplified in the Applicant's earlier U.S. Pat. Nos. 6,416,167 and 6,755,509, the contents of which are herein incorporated by reference.

Active Beam Having Optimal Stiffness in a Bend Direction

Figure 11:
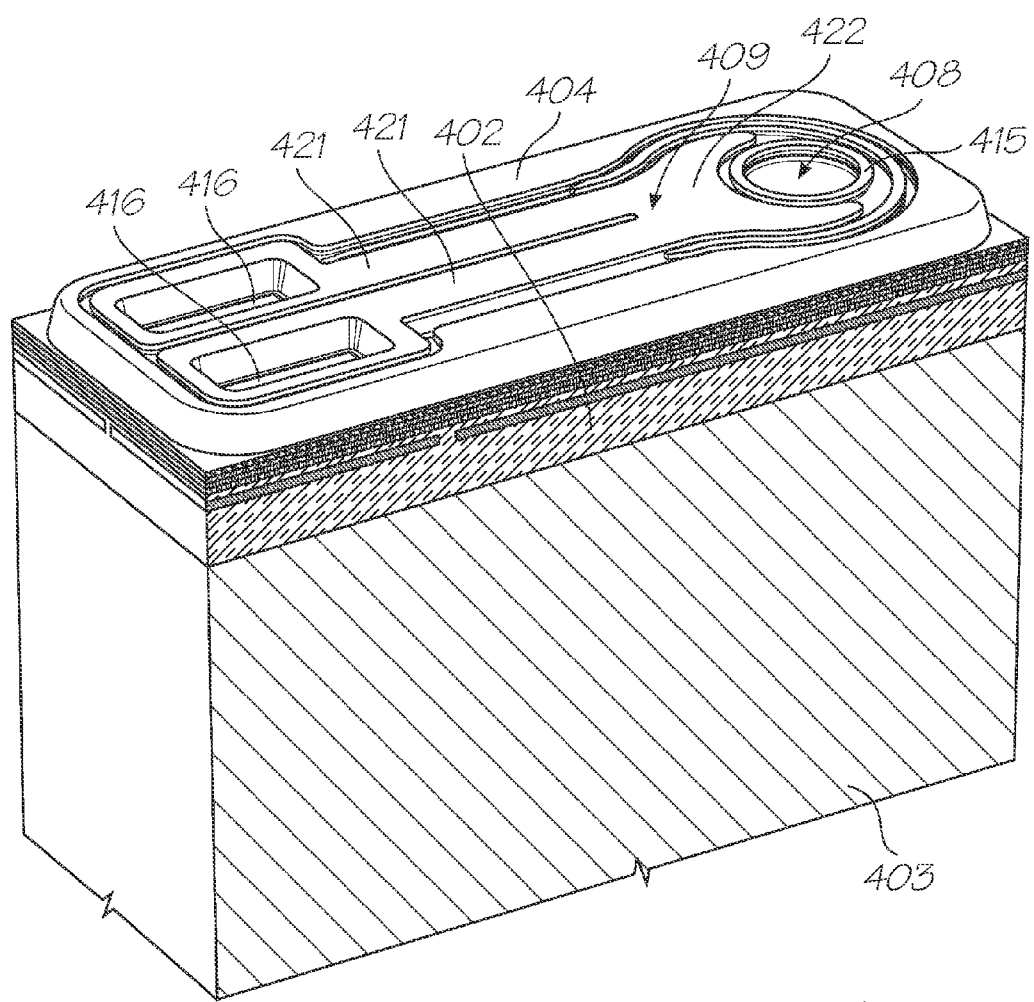
FIG. 11 is a perspective view of the nozzle assembly shown in FIG. 10.

Referring now to FIGS. 11 and 15, it will be seen that the upper active beams 411 and 511 of the actuators 410 and 510 are each comprised of a tortuous beam element having either a bent (in the case of beam 411) or serpentine (in the case of beam 511) configuration. The tortuous beam element is elongate and has a relatively small cross-sectional area suitable for resistive heating. In addition, the tortuous configuration enables respective ends of the beam element to be connected to respective contacts positioned at one end of the actuator, simplifying the overall design and construction of the nozzle assembly.

Referring specifically to FIGS. 14 and 15, an elongate beam element 520 has a serpentine configuration defining the elongate active cantilever beam 511 of the actuator 510. The serpentine beam element 520 has a planar, tortuous path connecting a first electrical contact 516 with a second electrical contact 516. The electrical contacts 516 (positive and ground) are positioned at one end of the actuator 510 and provide electrical connection between drive circuitry in the CMOS layers 502 and the active beam 511.

The serpentine beam element 520 is fabricated by standard lithographic etching techniques and defined by a plurality of contiguous beam members. In general, beam members may be defined as solid portions of beam material, which extend substantially linearly in, for example, a longitudinal or transverse direction. The beam members of beam element 520 are comprised of longer beam members 521, which extend along a longitudinal axis of the elongate cantilever beam 511, and shorter beam members 522, which extend across a transverse axis of the elongate cantilever beam 511. An advantage of this configuration for the serpentine beam element 520 is that it provides maximum stiffness in a bend direction of the cantilever beam 511. Stiffness in the bend direction is advantageous because it facilitates bending of the actuator 510 back to its quiescent position after each actuation.

It will be appreciated that the bent active beam configuration for the nozzle assembly 400 shown in FIG. 11 achieves the same or similar advantages to those described above in connection with nozzle assembly 500. In FIG. 11, the longer beam members, extending longitudinally, are indicated as 421, whilst the interconnecting shorter beam member, extending transversely, is indicated as 422.

It will, of course, be appreciated that the present invention has been described by way of example only and that modifications of detail may be made within the scope of the invention, which is defined in the accompanying claims.

The invention claimed is:

1. An inkjet nozzle assembly comprising:
  a nozzle chamber comprising a floor and a roof, said roof having a nozzle opening defined therein; and
  a thermal bend actuator defining a moving portion of said roof, said actuator comprising:
  an upper active beam for connection to drive circuitry;
  a first passive beam fused to the active beam; and
  a lower second passive beam fused to the second first passive beam, wherein said first passive beam is sandwiched between the active beam and the second passive beam such that when a current is passed through the active beam, the active beam expands relative to the passive beams, resulting in bending of the moving portion of the roof towards the floor and ejection of ink through the nozzle opening.

2. The inkjet nozzle assembly of claim 1, wherein said first passive beam is relatively more thermally insulating than said second passive beam.

3. The inkjet nozzle assembly of claim 1, wherein said first passive beam is comprised of silicon dioxide.

4. The inkjet nozzle assembly of claim 1, wherein said active beam is connected to said drive circuitry via a pair of electrical contacts positioned at one end of said actuator.

5. The inkjet nozzle assembly of claim 1, wherein the active beam is comprised of a vanadium-aluminium alloy.

6. The inkjet nozzle assembly of claim 1, wherein the nozzle opening is defined in the moving portion, such that the nozzle opening is moveable relative to the floor.

7. The inkjet nozzle assembly of claim 1, wherein the actuator is moveable relative to the nozzle opening.

8. An inkjet printhead comprising a plurality of inkjet nozzle assemblies according to claim 1 disposed on a substrate.

* * * * *